United States Patent
Tohoda (10) Patent No.: US 10,522,702 B2
(45) Date of Patent: Dec. 31, 2019

(54) SOLAR CELL MODULE AND SOLAR CELL MODULE MANUFACTURING METHOD

(71) Applicant: Panasonic Intellectual Property Management Co., Ltd., Osaka (JP)

(72) Inventor: Satoshi Tohoda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 359 days.

(21) Appl. No.: 15/228,207

(22) Filed: Aug. 4, 2016

(65) Prior Publication Data

US 2016/0343895 A1 Nov. 24, 2016

Related U.S. Application Data

(63) Continuation of application No. PCT/JP2015/000370, filed on Jan. 28, 2015.

(30) Foreign Application Priority Data

Feb. 6, 2014 (JP) ................. 2014-021323

(51) Int. Cl.
| | |
|---|---|
| H01L 31/054 | (2014.01) |
| H01L 31/18 | (2006.01) |
| H01L 31/0747 | (2012.01) |
| H01L 31/0224 | (2006.01) |
| H01L 31/0352 | (2006.01) |
| H01L 31/048 | (2014.01) |

(52) U.S. Cl.
CPC .... *H01L 31/054* (2014.12); *H01L 31/022458* (2013.01); *H01L 31/035281* (2013.01); *H01L 31/048* (2013.01); *H01L 31/0747* (2013.01)

(58) Field of Classification Search
CPC .................................................. H01L 31/0543
See application file for complete search history.

(56) References Cited

U.S. PATENT DOCUMENTS

| | | | |
|---|---|---|---|
| 2005/0016580 A1 | 1/2005 | Haga | |
| 2010/0147363 A1* | 6/2010 | Huang | B32B 17/10009 |
| | | | 136/251 |
| 2011/0000523 A1 | 1/2011 | Haga | |

(Continued)

FOREIGN PATENT DOCUMENTS

| | | |
|---|---|---|
| JP | 2005-019901 A | 1/2005 |
| JP | 2014-135319 A | 7/2014 |
| WO | 2014/132312 A1 | 9/2014 |

OTHER PUBLICATIONS

Search Report received in corresponding International Application No. PCT/JP2015/000370, dated Apr. 21, 2015.

*Primary Examiner* — Tae-Sik Kang
(74) *Attorney, Agent, or Firm* — McDermott Will & Emery LLP (57) ABSTRACT

A solar cell element includes a plurality of finger electrodes and a bus bar electrode on a surface thereof. A light diffuser is provided in an outer circumferential region of the surface. The light diffuser includes first light diffusers provided along the left side and the right side of the surface, and second light diffusers provided along the upper side and the lower side of the surface. The width of the first light diffuser in a transverse direction perpendicular to the left side or the right side, is smaller than the width of the second light diffuser in a transverse direction perpendicular to the upper side or the lower side.

8 Claims, 5 Drawing Sheets

(56) References Cited

U.S. PATENT DOCUMENTS

| | | | |
|---|---|---|---|
| 2012/0285504 A1* | 11/2012 | Maekawa | H01L 31/022425 136/244 |
| 2013/0125952 A1* | 5/2013 | Sumitomo | H01L 31/048 136/244 |
| 2013/0247963 A1* | 9/2013 | Ishiguro | H01L 31/048 136/251 |
| 2015/0364616 A1 | 12/2015 | Tohoda | |

\* cited by examiner

SOLAR CELL MODULE AND SOLAR CELL MODULE MANUFACTURING METHOD

RELATED APPLICATION

Priority is claimed to Japanese Patent Application No. 2014-021323, filed on Feb. 6, 2014, the entire content of which is incorporated herein by reference.

BACKGROUND

1. Field of the Invention

The present invention relates to a solar cell module and a method for manufacturing the solar cell module.

2. Description of the Related Art

For a certain reason of a manufacturing process, a light receiving surface that is a light-incident surface of a solar cell, sometimes includes an ineffective region provided thereon, the ineffective region barely contributing to power generation even when light is incident on a region positioned at the outer circumference of the light receiving surface. In a solar cell including this type of ineffective region provided therein, a structure in which a light diffuser is provided on the ineffective region and light incident on the ineffective region diffuses so that the incident light is effectively used, has been proposed.

SUMMARY

Recently, a demand for further improvement of power generation efficiency of a solar cell module, has been made.

The present invention has been made in consideration of the above situation. An object of the present invention is to provide a technique capable of improving power generation efficiency of a solar cell module.

In order to solve the problem, an aspect of the present invention is a solar cell module. The solar cell module includes: a solar cell element including a plurality of finger electrodes that extends in parallel to each other and a bus bar electrode that extends cross the plurality of finger electrodes, on a surface thereof; a light diffuser provided in an outer circumferential region of the surface; and an encapsulant covering the surface and the light diffuser. The surface includes a left side and a right side parallel to the finger electrodes and an upper side and a lower side parallel to the bus bar electrode. The light diffuser includes a first light diffuser provided along each of the left side and the right side, and a second light diffuser provided along each of the upper side and the lower side. The width of the first light diffuser in a transverse direction perpendicular to the left side or the right side is smaller than the width of the second light diffuser in a transverse direction perpendicular to the upper side or the lower side.

Another aspect of the present invention is a method for manufacturing a solar cell module. The method includes: preparing a solar cell element, a material having light diffusivity, and an encapsulant that seals the solar cell element, the solar cell element including a plurality of finger electrodes extending in parallel to each other, and a bus bar electrode extending cross the plurality of finger electrodes, on a surface thereof, the surface including a left side and a right side parallel to the finger electrodes and an upper side and a lower side parallel to the bus bar electrode; disposing the material in an outer circumferential region of the surface such that a width of the material provided along the left side and the right side, in a transverse direction perpendicular to the left side or the right side, is smaller than a width of the material provided along the upper side and the lower side, in a transverse direction perpendicular to the upper side and the lower side; and sealing the solar cell element including the material disposed thereon, with the encapsulant.

BRIEF DESCRIPTION OF THE DRAWINGS

Embodiments will now be described, byway of example only, with reference to the accompanying drawings which are meant to be exemplary, not limiting, and wherein like elements are numbered alike in several Figures, in which.

DETAILED DESCRIPTION

The invention will now be described by reference to the preferred embodiments. This does not intend to limit the scope of the present invention, but to exemplify the invention.

An embodiment of the present invention will be described in detail below with reference to the drawings. Note that the same elements are denoted with the same reference signs, and the duplicate descriptions thereof will be appropriately omitted.

An outline will be described before the present invention is specifically described. The embodiment of the present invention is a solar cell module including a solar cell element sealed with an encapsulant. The solar cell element includes a plurality of finger electrodes extending in parallel to each other and a bus bar electrode extending perpendicular to the plurality of finger electrodes on a surface thereof. The surface includes a left side and a right side parallel to the finger electrodes, and an upper side and a lower side parallel to the bus bar electrode. A light diffuser is provided in an outer circumferential region of the surface. The light diffuser includes a first light diffuser provided along each of the left side and the right side, and a second light diffuser provided along each of the upper side and the lower side. The light diffuser has the width of the first light diffuser in a transverse direction perpendicular to the left side or the right side, smaller than the width of the second light diffuser in a transverse direction perpendicular to the upper side or the lower side.

The light diffuser has light diffusivity with respect to light incident on the surface. The light diffuser diffuses light incident on the outer circumferential region and transmits the light to an inner region positioned inside the outer circumferential region. The outer circumferential region including the light diffuser provided therein is positioned in proximity to an end portion of each of the finger electrodes or the bus bar electrode for collecting carriers, or apart from the end portion. Thus, the outer circumferential region has lower collecting efficiency of the carriers in comparison to the inner region, and barely contributes to power generation even when the light is incident. This is because even when the light is incident on the outer circumferential region and the carriers are generated, a possibility that the carriers are recombined before reaching a collecting electrode is high. In particular, a region along the upper side or the lower side near the end portion of each of the finger electrodes in the outer circumferential region, has lower collecting efficiency of the carriers in comparison to a region along the left side or the right side near the end portion of the bus bar electrode. According to the present embodiment, the light diffuser is provided in the above outer circumferential region so as to cause the inner region to absorb the light to be absorbed in the outer circumferential region. The width of the second light diffuser provided in the region, having lower current collecting efficiency, along the upper side or the lower side, increases. Accordingly, power generation efficiency of the solar cell module improves in comparison to a case where the light diffuser is not provided.

Figure 1:
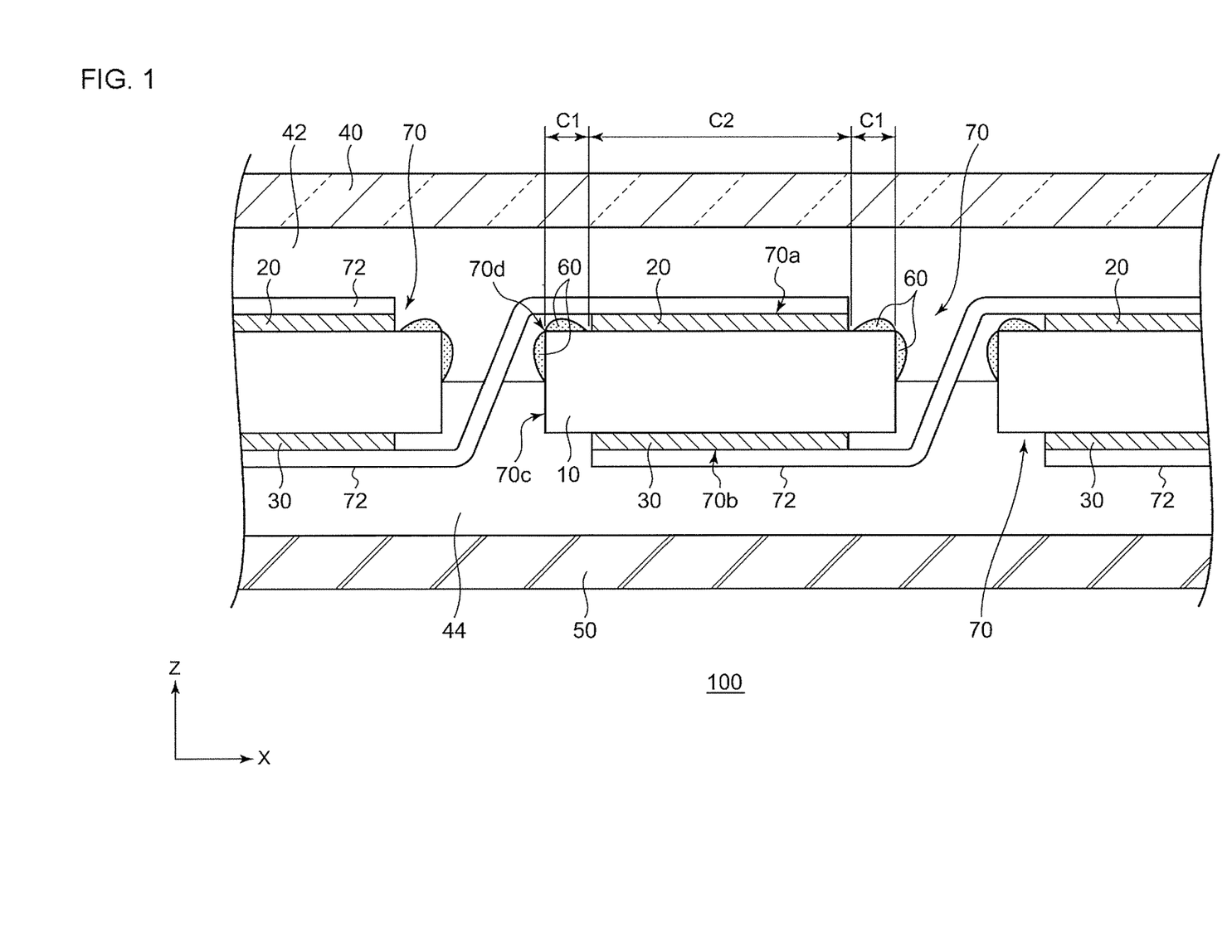
FIG. 1 is a sectional view of a structure of a solar cell module according to an embodiment.

FIG. 1 is a sectional view of a structure of the solar cell module 100 according to the embodiment.

The solar cell module 100 according to the embodiment includes a plurality of solar cell elements 70, a light diffuser 60 provided in an outer circumferential region C1 of a light receiving surface 70a that is one surface of each of the solar cell elements 70, and tab wiring 72 that is a connection member mutually connecting the adjacent solar cell elements 70. The solar cell module 100 includes a protective substrate 40, a back sheet 50, a first encapsulant 42, and a second encapsulant 44.

The light diffuser 60 includes a material having light diffusivity with respect to light having a wavelength absorbed by the solar cell element 70. Here, having the light diffusivity refers to a property in which light incident on the light diffuser 60 is mainly reflected by diffuse reflection instead of specular reflection. The light diffuser 60 includes a material having an electrical insulation property. As the light diffuser 60 having the above properties, an insulating white material including particles, such as titania ($TiO_2$) or alumina ($Al_2O_3$), dispersed in a resin base material, such as an epoxy resin or an acrylic resin, is used. Therefore, the light diffuser 60 has lower electric conductivity in comparison to a first metal electrode 20, and higher light diffusivity in comparison to the first metal electrode 20. The light diffuser 60 is required to have a degree of thickness capable of sufficiently diffusing the incident light. The thickness is preferably in a range of from 3 to 100 μm, and, for example, is preferably in a range of from 20 to 30 μm.

In order that the incident light to be transmitted to a side surface 70c of each of the solar cell elements 70 can be diffused, the light diffuser 60 is formed so as to cover at least a part of the side surface 70c. The light diffuser 60 is provided to both of the light receiving surface 70a and the side surface 70c so that the light incident on the light diffuser 60 can be effectively diffused. Note that the light diffuser 60 is formed so as to avoid an edge portion 70d formed of the light receiving surface 70a and the side surface 70c. The light diffuser 60 is formed so as to avoid the edge portion 70d. Thus, an amount of the resin material necessary for forming the light diffuser 60 can be reduced, in comparison to a case where the light diffuser 60 is provided so as to cover the edge portion 70d. The light diffuser 60 is formed so as to avoid the edge portion 70d. The edge portion 70d is exposed even after the light diffuser 60 is formed. Thus, the outer circumference of each of the solar cell elements 70 can be visually recognized easily. Accordingly, pattern recognition can be easily performed in a case where positioning is performed using a technique, such as image recognition.

The light diffuser 60 diffuses and transmits the light incident on the outer circumferential region C1 to an inner region C2 of the light receiving surface 70a. The light that has been incident on the light diffuser 60 and has been diffused, is incident on the inner region C2 by total reflection on an interface between the protective substrate 40 and outer air, for example. The outer circumferential region C1 is positioned in proximity to an end portion of the first metal electrode 20 that collects the carriers, or apart from the end portion. Thus, the outer circumferential region C1 has lower collecting efficiency of the carriers in comparison to the inner region C2, and barely contributes to the power generation even when the light is incident. The light diffuser 60 is provided in the above outer circumferential region C1 so that the inner region C2 absorbs the light to be absorbed in the outer circumferential region C1.

The tab wiring 72 includes thin metal foil, and, for example, includes copper foil coated with silver, and aluminum foil. One end of the tab wiring 72 is connected to the first metal electrode 20 of the solar cell element 70, and the other end is connected to a second metal electrode 30 of another solar cell element 70 mutually connected thereto. Note that the tab wiring 72 is provided in a direction in which the bus bar electrode, to be described later, extends (x direction). The tab wiring 72 is connected to a bus bar electrode included in the first metal electrode 20 and a bus bar electrode included in the second metal electrode 30.

The protective substrate 40 and the back sheet 50 protect the solar cell element 70 from an external environment. The protective substrate 40 provided on the side of the light receiving surface 70a transmits light in a wavelength band absorbed by the solar cell element 70 for the power generation. The protective substrate 40 is, for example, a glass substrate. Example of the back sheet 50 is a resin substrate, such as polyethylene terephthalate (PET) or polyimide, or a glass substrate like the protective substrate 40.

The first encapsulant 42 and the second encapsulant 44 include a resin material, such as EVA or polyimide. Accordingly, this prevents the penetration of moisture or the like into an electricity generation layer of the solar cell module 100. In addition, strength of the entire solar cell module 100 is improved. Note that a white resin material including particles of titania dispersed therein, may be used for the second encapsulant 44 on the side of a back surface 70b. Accordingly, the light that has been transmitted to the solar cell element 70 and has reached the second encapsulant 44, can be diffused and transmitted back to the solar cell element 70 again.

Each of the solar cell elements 70 includes the electricity generation layer 10, the first metal electrode 20, and the second metal electrode 30.

The electricity generation layer 10 includes the light receiving surface 70a that is a surface of the solar cell element 70, and the back surface 70b that is a surface of the solar cell element 70 and faces in a direction opposite to the light receiving surface 70a. Here, the light receiving surface refers to a main surface on which sunlight is mainly incident on the solar cell element 70. Specifically, the light receiving surface is a surface on which most of the light incident on the electricity generation layer 10 is incident.

The electricity generation layer 10 is a layer that absorbs the incident light and generates a photovoltaic effect. The electricity generation layer 10 has a substrate including a semiconductor material, such as crystalline silicon, gallium arsenide (GaAs), or indium phosphide (InP). A structure of the electricity generation layer 10 includes, but is not particularly limited to, a heterojunction between an n-type single crystal silicon substrate and amorphous silicon according to the present embodiment. For example, the electricity generation layer 10 includes an i-type amorphous silicon layer, a p-type amorphous silicon layer including boron (B) or the like doped therein, and a transparent conductive layer including a translucent conductive oxide, such as an indium oxide, in this order, disposed on a first main surface on the side of the light receiving surface 70a of the n-type single crystal silicon substrate. An i-type amorphous silicon layer, an n-type amorphous silicon layer including phosphorus (P) or the like doped therein, and a transparent conductive layer, in this order, disposed on a second main surface on the side of the back surface 70b of the single crystal silicon substrate.

Note that according to the present embodiment, the i-type amorphous layer, the p-type amorphous layer, and the transparent conductive layer provided on the first main surface of the semiconductor substrate included in the electricity generation layer 10, are formed on the first main surface so as to cover substantially an entire surface of the first main surface including the outer circumferential region C1 and the inner region C2. Similarly, the i-type amorphous layer, the n-type amorphous layer, and the transparent conductive layer provided on the second main surface of the semiconductor substrate included in the electricity generation layer 10, are formed on the second main surface so as to cover substantially an entire surface of the second main surface including the outer circumferential region C1 and the inner region C2. In other words, the amorphous semiconductor layer having one conductive type corresponding to a p-type or an n-type, is formed on the first main surface or the second main surface of the semiconductor substrate so as to cover substantially an entire surface of the main surface including the outer circumferential region C1.

The first metal electrode 20 and the second metal electrode 30 are electrodes for taking out the electrical power generated by the electricity generation layer 10. The first metal electrode 20 is provided on the light receiving surface 70a of the solar cell element 70. The second metal electrode 30 is provided on the back surface 70b facing the light receiving surface 70a. The first metal electrode 20 and the second metal electrode 30 include, for example, a conductive material including copper (Cu) or aluminum (Al). Note that an electrolytic plating layer, such as copper (Cu) or tin (Sn), may be included. Note that the electrodes are not limited to this, and may include another metal, such as gold or silver, another conductive material, or a combination thereof.

Figure 2:
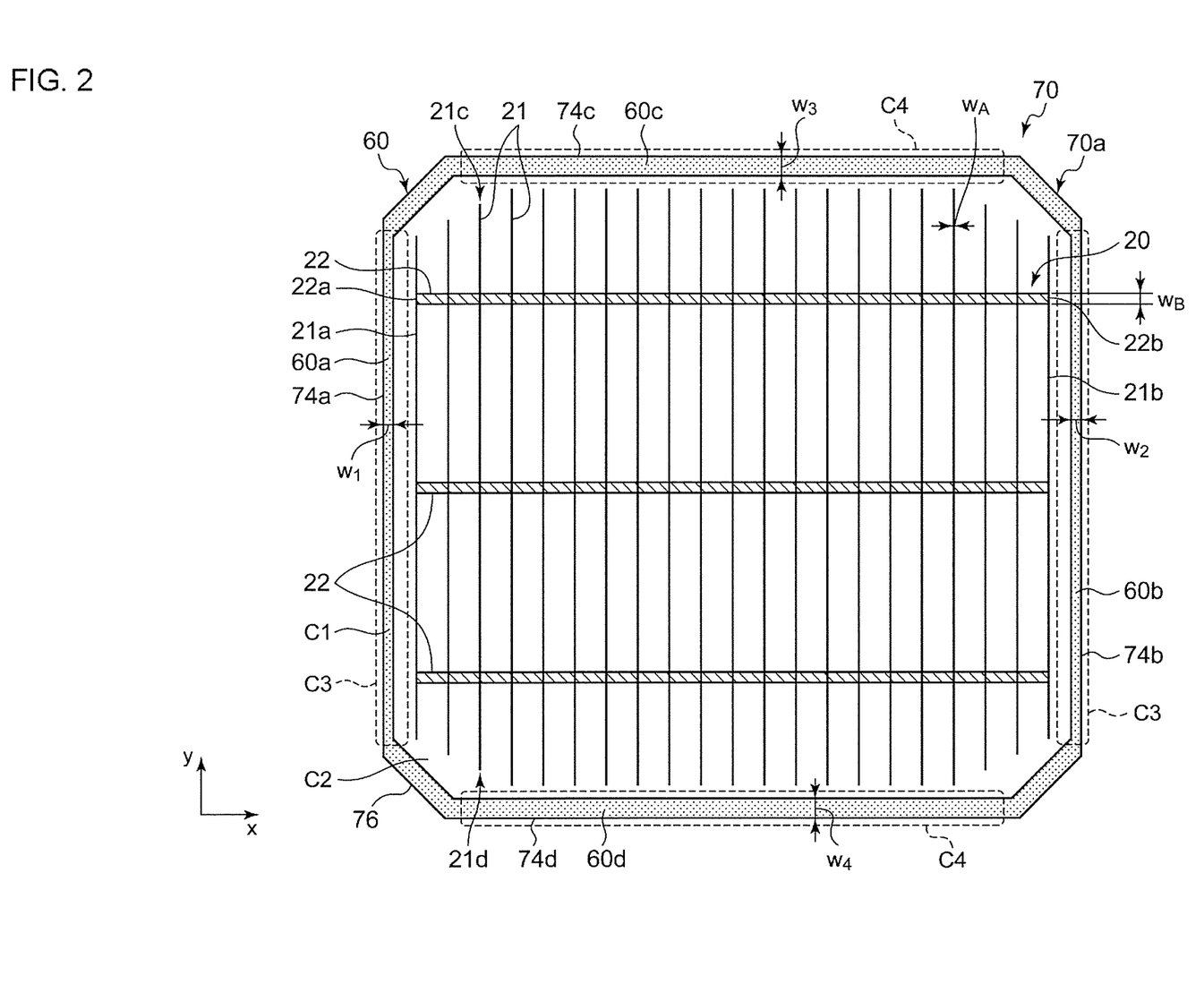
FIG. 2 is an outline view of a light receiving surface of a solar cell element according to the embodiment.

FIG. 2 is an outline view of the light receiving surface 70a of the solar cell element 70 according to the embodiment.

The light receiving surface 70a has an octagonal shape including four sides 74a to 74d and corner portions 76 made at four corners by corner-cutoff. For convenience of the descriptions, the four sides 74a to 74d are also referred to as a left side 74a, a right side 74b, an upper side 74c, and a lower side 74d, respectively, below. Here, the left side 74a and the right side 74b are sides extending in parallel to the finger electrodes 21, and are sides extending in a direction perpendicular to the bus bar electrode 22 (y direction). The upper side 74c and the lower side 74d are sides extending in parallel to the bus bar electrode 22, and are sides extending in a direction perpendicular to the finger electrodes 21 (x direction).

In the outer circumferential region C1, a region along the left side 74a or the right side 74b, in other words, a region near a left end portion 22a or a right end portion 22b of the bus bar electrode 22 is also referred to as a bus bar end region C3. Meanwhile, a region along the upper side 74c or the lower side 74d, in other words, a region near an upper end portion 21c or a lower end portion 21d of each of the finger electrodes 21 is also referred to as a finger end region C4. Since the bus bar end region C3 is close to the bus bar electrode 22, and also, a left end finger electrode 21a or a right end finger electrode 21b extends close thereto, the bus bar end region C3 has higher collecting efficiency of the carriers in comparison to the finger end region C4. Note that the current collecting efficiency decreases as a region in any of the bus bar end region C3 and the finger end region C4 comes close to the sides 74. The current collecting efficiency tends to increase as the region comes close to the center. A region along each of the corner portions 76 also is a region having low current collecting efficiency.

The first metal electrode 20 includes the plurality of finger electrodes 21 extending in parallel to each other, and three bus bar electrodes 22 extending perpendicular to the finger electrodes 21.

The finger electrodes 21 are distributed over substantially an entire surface of the light receiving surface 70a in order to effectively collect the generated electrical power. In the plurality of finger electrodes 21 provided in parallel to each other, the left end finger electrode 21a is provided near the left side 74a and the right end finger electrode 21b is provided near the right side 74b. The upper end portion 21c of each of the finger electrodes 21 extending in the y direction is provided near the upper side 74c. The lower end portion 21d of each of the finger electrodes 21 is provided near the lower side 74d.

The finger electrodes 21 are electrodes formed on the light receiving surface 70a. Thus, the finger electrodes 21 are preferably thinly formed so as not to interrupt the light to be incident on the electricity generation layer 10. For example, the width $w_A$ of each of the finger electrodes 21 in a transverse direction is preferably approximately 80 μm.

Each of the bus bar electrodes 22 is provided so as to extend from the left end finger electrode 21a to the right end finger electrode 21b in the x direction. Thus, each of the bus bar electrodes 22 connects the plurality of finger electrodes 21 in parallel, each other. Therefore, the left end portion 22a of each of the bus bar electrodes 22 is provided near the left side 74a. The right end portion 22b of each of the bus bar electrodes 22 is provided near the right side 74b.

Each of the bus bar electrodes 22 is required to be thinly formed so as not to interrupt the light to be incident on the electricity generation layer 10. In addition, each of the bus bar electrodes 22 is required to have a degree of thick width so as to effectively pass the electrical power collected from the plurality of finger electrodes 21, therethrough. For example, the width $w_B$ of each of the bus bar electrodes 22 in a transverse direction is preferably approximately 100 μm.

Note that the second metal electrode 30 provided on the back surface 70b includes a plurality of finger electrodes extending in parallel to each other and three bus bar electrodes extending perpendicular to the finger electrodes as in the first metal electrode 20. Note that the side of the back surface 70b is not a main surface on which sunlight is mainly incident. Thus, the number of the finger electrodes on the side of the back surface 70b may increase so as to be more than that on the side of the light receiving surface 70a and so as to increase the current collecting efficiency.

The light diffuser 60 is provided along the sides 74 and the corner portions 76 so as to cover an entire surface of the outer circumferential region C1 on the light receiving surface 70a. In order that the light to be transmitted to the outer circumferential region C1 can be effectively incident on the inner region C2, the widths $w_1$ to $w_4$ of the light diffuser 60 in a transverse direction perpendicular to the sides 74 or the corner portions 76 are provided thicker than the width $w_A$ of each of the finger electrodes 21 and the width $w_B$ of each of the bus bar electrodes 22. For example, the light diffuser 60 is provided so that the widths $w_1$ to $w_4$ in the transverse direction are 200 μm or more.

The light diffuser 60 includes first light diffusers 60a and 60b provided along the left side 74a and the right side 74b, and second light diffusers 60c and 60d provided along the upper side 74c and the lower side 74d, respectively.

The first light diffusers 60a and 60b are formed so as to have a width in a transverse direction narrower than those of the second light diffusers 60c and 60d. The bus bar end region C3 has relatively high current collecting efficiency in the outer circumferential region C1. The light diffuser 60 is provided so as to have a narrow width in regions adjacent to the left side 74a and the right side 74b, the regions having the current collecting efficiency decreased in the bus bar end region C3. That is, the width of the light diffuser 60 is preferably made to be narrower at each of the left side 74a and the right side 74b than that at each of the upper side 74c and the lower side 74d. The widths $w_1$ and $w_2$ of the first light diffusers 60a and 60b are, for example, at least in a range of from 100 to 900 μm, preferably, approximately 600 μm.

Meanwhile, the second light diffusers 60c and 60d are formed so as to have a width in the transverse direction wider than those of the first light diffusers 60a and 60b. This is because the finger end region C4 has relatively low current collecting efficiency in the outer circumferential region C1, and thus increasing the width of the light diffuser 60 for diffusing the light into other regions is more effective for easily increasing the electricity generation efficiency. The widths $w_3$ and $w_4$ of the second light diffusers 60c and 60d are, for example, at least in a range of from 200 μm to 3 mm, preferably, approximately 1 mm.

Note that the light diffuser 60 is also provided in a region along each of the corner portions 76. Each of the corner portions 76 is also near the end portions of the finger electrodes, and is a region having low current collecting efficiency. Thus, the light diffuser is provided at each of the corner portions 76 so that the power generation efficiency can increase. The region along each of the corner portions 76 is a region having particularly low current collecting efficiency in the outer circumferential region C1. Thus, the width of the light diffuser 60 is preferable formed thicker than those in the regions along the sides 74. The width of the light diffuser provided at each of the corner portions 76 is, for example, at least in a range of from 500 μm to 3 mm, preferably, approximately 1.7 mm.

Next, an exemplary method for manufacturing the solar cell module 100 will be described.

Figure 3:
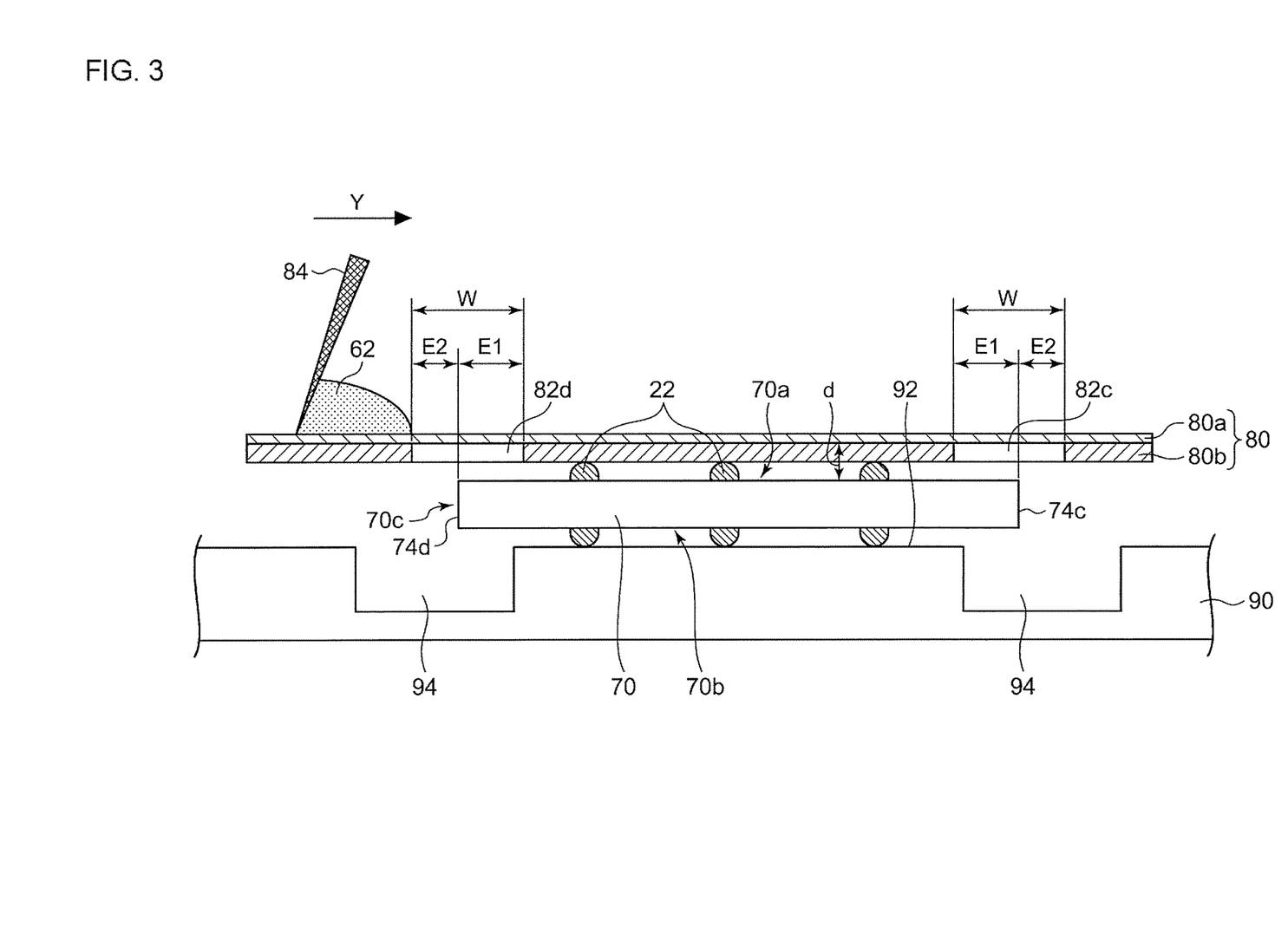
FIG. 3 is a view of a process of applying a light diffuser by screen printing according to the embodiment.
Figure 4:
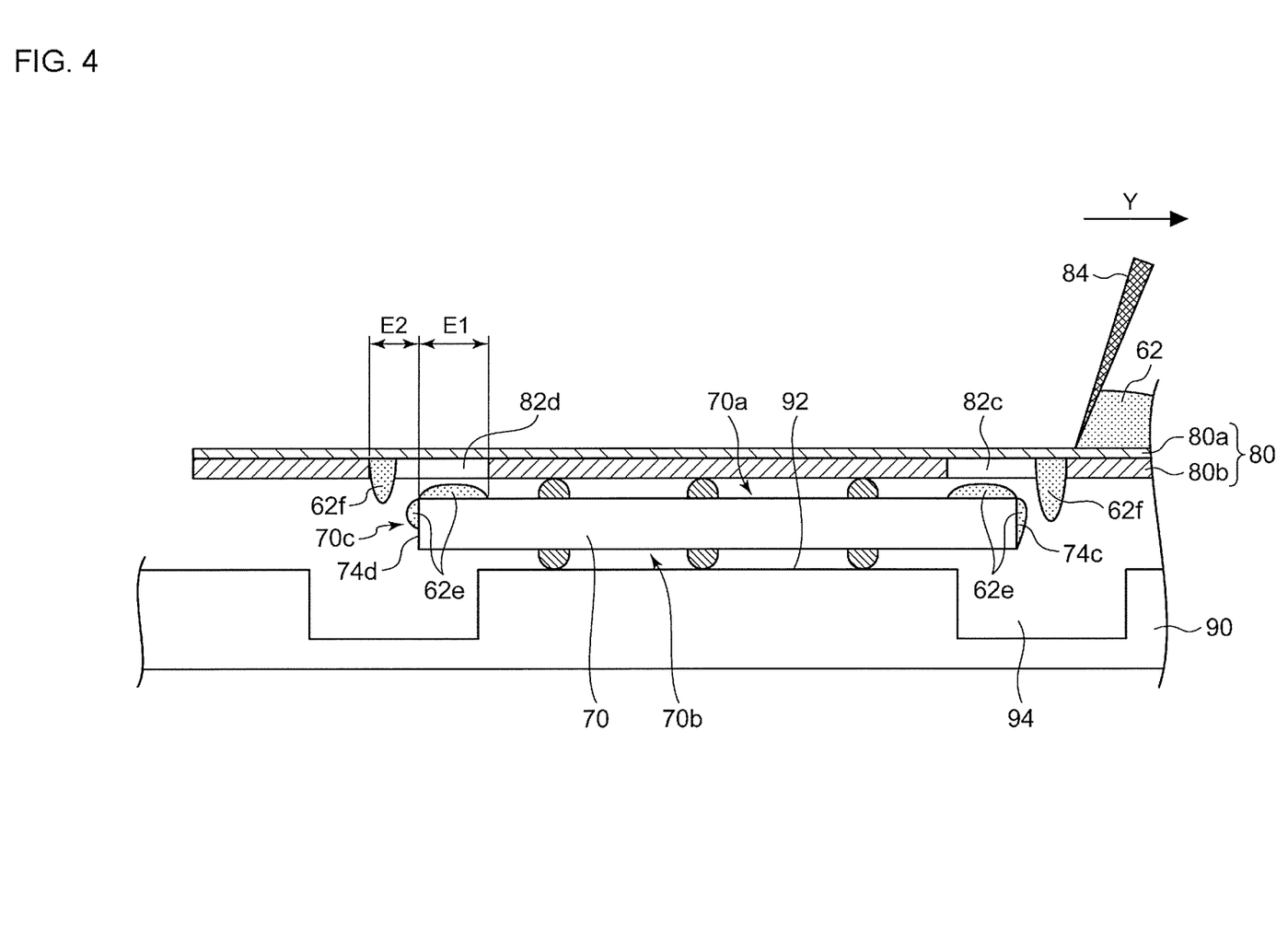
FIG. 4 is a view of a process of applying the light diffuser by the screen printing according to the embodiment.

FIGS. 3 and 4 are views of processes of applying the light diffuser by screen printing according to the embodiment. The solar cell element 70 is disposed on a stage 90 including a groove 94 provided thereon. After that, a printing plate 80 including openings 82c and 82d is disposed on the light receiving surface 70a of the solar cell element 70. A squeegee 84 moves in the Y direction so that coating 62 is applied to the light receiving surface 70a through the printing plate 80.

The coating 62 is applied by moving the squeegee 84 in the Y direction in which the finger electrodes extend, after the finger electrodes and the bus bar electrodes 22 are formed on the light receiving surface 70a of the solar cell element 70. Applying the coating 62 after the bus bar electrodes 22 are provided can ensure a distance d between the light receiving surface 70a and a mesh 80a, in comparison to a case where the bus bar electrodes 22 are not present. Thus, the coating 62 can be made thick. Printing in the direction in which the finger electrodes extend is made so that damage of the finger electrodes to be caused in printing can be prevented in comparison to a case where the printing is made in a direction cross the finger electrodes.

The printing plate 80 includes the metal mesh 80a and emulsion 80b to be disposed in accordance with a pattern of the printing plate 80. A region in which the emulsion 80b is provided is a region to which the coating 62 is not applied. A region W in which the emulsion 80b is not provided corresponds to the openings 82c and 82d of the printing plate 80. The opening region W is provided so that the outer circumference is larger than an applying region E1 on the light receiving surface 70a. The opening region W extends over both of the applying region E1 and an extension region E2 provided to surround the outer circumference of the applying region E1. Providing an opening in a region corresponding to the extension region E2 can also apply the coating 62 to the side surface 70c.

Note that the solar cell element 70 is not provided below the extension region E2. Thus, coating 62f squeezed out by the squeegee 84 is easily accumulated in a position corresponding to the extension region E2. Using the accumulated coating 62f, the coating can be applied to the side surface 70c. However, when the solar cell element 70 is disposed on a flat stage, there is a risk that the coating 62f adheres to the stage. As a result, the coating will bond the stage and the solar cell element 70, and thus at the time of attempting to raise the solar cell element 70 from the stage, the solar cell element 70 can be damaged by a stress applied thereto. Therefore, used is the stage 90 including the groove 94 provided in a position corresponding to the outer circumference of the solar cell element 70. Accordingly, this prevents the adhesion of the coating 62 to the stage 90.

Figure 5:
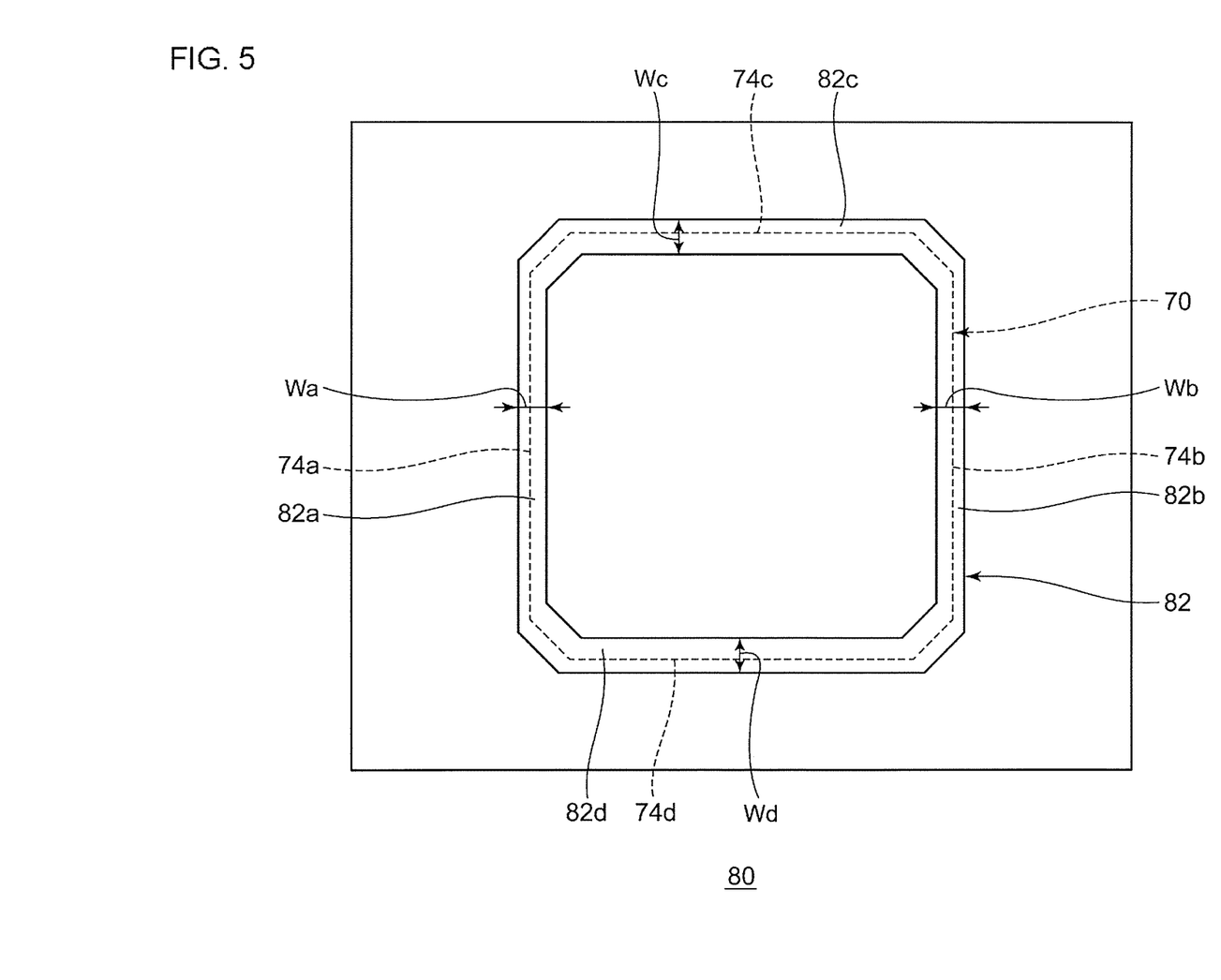
FIG. 5 is a top view of a printing plate used for applying the light diffuser according to the embodiment.

FIG. 5 is a top view of the printing plate used for applying the light diffuser according to the embodiment. In the present figure, the position corresponding to the outer circumference of the solar cell element 70 is indicated with a broken line.

The printing plate 80 includes a pattern 82 having a framed shape in accordance with a shape of the outer circumferential region C1 of the light receiving surface 70a. The pattern 82 includes openings 82a to 82d in regions corresponding to the four sides 74a to 74d of the solar cell element 70, respectively. As illustrated, the opening widths Wa and Wb of the openings 82a and 82b corresponding to the left side 74a and the right side 74b are smaller than the opening widths We and Wd of the opening 82c and 82d corresponding to the upper side 74c and the lower side 74d. Using the printing plate 80 including the above pattern 82 can make the width of the coating 62 to be applied along the left side 74a and the right side 74b in a transverse direction, smaller than the width of the coating 62 to be applied along the upper side 74c and the lower side 74d in a transverse direction.

After that, coating 62e applied by the screen printing hardens so that the light diffuser 60 is formed.

After each of the solar cell elements 70 on which the light diffuser 60 is formed is connected by the tab wiring 72, the first encapsulant 42 and the protective substrate 40 are disposed on the side of the light receiving surface 70a and the second encapsulant 44 and the back sheet 50 are disposed on the back surface 70b. Thermal press bonding is performed in a state where each of the solar cell elements 70 has been interposed between the protective substrate 40 and the back sheet 50. Accordingly, the first encapsulant 42 and the second encapsulant 44 fuse so that the solar cell module 100 is formed as illustrated in FIG. 1.

Effects achieved by the light diffuser 60 according to the present embodiment will be described below.

According to the present embodiment, the widths of the first light diffusers 60a and 60b provided along the left side 74a and the right side 74b are narrower and the widths of the second light diffusers 60c and 60d provided along the upper side 74c and the lower side 74d are wider. The second light diffusers 60c and 60d having a wider width are provided in the finger end region C4 having low current collecting efficiency. Thus, the light incident on the finger end region C4 can be effectively used. The first light diffusers 60a and 60b having a narrower width are provided in the bus bar end region C3 having relatively high current collecting efficiency. Thus, the light incident on proximity to the left side 74a or the right side 74b can be effectively used. Accordingly, the power generation efficiency of the solar cell module 100 can increase.

According to the present embodiment, the light diffuser 60 is provided so as to cover the entire surface of the outer circumferential region C1 of the light receiving surface 70a. Thus, sealing performance of the solar cell module 100 can increase. This is because the light diffuser 60 has higher adhesion to the first encapsulant 42 in comparison to a transparent electrode layer exposed on the light receiving surface 70a of each of the solar cell elements 70. The second light diffusers 60c and 60d have a width wider than those of the first light diffusers 60a and 60b. Thus, adhesion strength in the x direction along the upper side 74c and the lower side 74d increase. The tab wiring 72 extends in the x direction. Stress in the x direction is easily applied to the solar cell module 100 due to connection of the tab wiring 72. According to the present embodiment, the second light diffusers 60c and 60d having a wide width can increase the adhesion strength in the x direction. Thus, reliability of the solar cell module 100 can be improved.

According to the present embodiment, the light diffuser 60 is provided to the outer circumferential region C1 of the light receiving surface 70a and the side surface 70c. Thus, an outer circumferential end of each of the solar cell elements 70 can be protected. The light diffuser 60 is provided along the four sides 74. Thus, the light receiving surface 70a of each of the solar cell elements 70 can have a structure strong with respect to force applied in a bending direction. The light diffuser 60 is provided around the edge portion 70d of each of the solar cell elements 70. Thus, a structure strong with respect to impact applied to the edge portion 70d, can be made, protecting the edge portion 70d.

According to the present embodiment, the coating 62 is applied in the direction in which the finger electrodes extend. Thus, the upper side 74c and the lower side 74d on which the coating 62 has a wide applying width, can be arranged as a printing start position or a printing end position. For example, when the left side 74a or the right side 74b having a narrow applying width of the coating 62 is arranged as the printing start position or the printing end position, it is difficult to apply the coating 62 with a constant width because the applying width is narrow. In addition, when the left side 74a or the right side 74b is arranged as the printing start position or the printing end position, the printing is performed in a direction cross the finger electrodes. Thus, there is a risk that the finger electrodes are detached and damaged in a process of applying the coating 62. According to the present embodiment, the upper side 74c and the lower side 74d having a wide applying width are arranged as the printing start position or the printing end position. Thus, an applying defect can be prevented when the coating 62 is printed.

One aspect is as follows: A solar cell module 100 according to an aspect includes: a solar cell element 70 including a plurality of finger electrodes 21 that extends in parallel to each other and a bus bar electrode 22 that extends cross the plurality of finger electrodes 21, on a surface (light receiving surface 70a) thereof; a light diffuser 60 provided in an outer circumferential region C1 of the surface (light receiving surface 70a); and an encapsulant (first encapsulant 42) covering the surface (light receiving surface 70a) and the light diffuser 60.

The surface (light receiving surface 70a) includes a left side 74a and a right side 74b parallel to the finger electrodes 21 and an upper side 74c and a lower side 74d parallel to the bus bar electrode 22.

The light diffuser 60 includes first light diffusers 60a and 60b provided along the left side 74a and the right side 74b, and second light diffusers 60c and 60d provided along the upper side 74c and the lower side 74d. The widths $w_1$ and $w_2$ of the first light diffusers 60a and 60b in a transverse direction perpendicular to the left side 74a or the right side 74b is smaller than the widths $w_3$ and $w_4$ of the second light diffusers 60c and 60d in a transverse direction perpendicular to the upper side 74c or the lower side 74d.

The solar cell element 70 may include a semiconductor substrate and a semiconductor layer that is provided on the semiconductor substrate and has one conductive type. The semiconductor layer may be formed on the semiconductor substrate so as to cover an entire surface of the semiconductor substrate including an outer circumferential region C1.

The surface (light receiving surface 70a) may have an octagonal shape made by corner-cutting off four corners of a rectangle surrounded with the left side 74a, the right side 74b, the upper side 74c, and the lower side 74d. The light diffuser 60 may be further provided along the corner portions 76 made by the corner-cutoff.

The width of the light diffuser 60 in the transverse direction may be larger than the width $w_A$ of each of the finger electrodes 21 in a transverse direction.

The light diffuser 60 may be further provided on a side surface 70c of the solar cell element 70.

Another aspect is a method for manufacturing the solar cell module 100. The method includes: preparing a solar cell element 70, a material having light diffusivity, and an encapsulant that seals the solar cell element 70, the solar cell element 70 including a plurality of finger electrodes 21 extending in parallel to each other, and a bus bar electrode 22 extending cross the plurality of finger electrodes 21, on a surface (light receiving surface 70a) thereof, the surface (light receiving surface 70a) including a left side 74a and a right side 74b parallel to the finger electrodes 21 and an upper side 74c and a lower side 74d parallel to the bus bar electrode 22; disposing the material in an outer circumferential region C1 of the surface (light receiving surface 70a) such that the widths $w_1$ and $w_2$ of the material provided along the left side 74a and the right side 74b, in a transverse direction perpendicular to the left side 74a or the right side 74b, is smaller than the widths $w_3$ and $w_4$ of the material provided along the upper side 74c and the lower side 74d, in a transverse direction perpendicular to the upper side 74c and the lower side 74d; and sealing the solar cell element 70 including the material disposed thereon, with the encapsulant.

The method for manufacturing the solar cell module 100 may further include disposing the material by screen printing in a direction in which the finger electrodes 21 extend.

The present invention has been described above with reference to the above respective embodiments. The present invention is not limited to the above respective embodiments, and includes appropriate combinations of configurations of the respective embodiments or replacements. Based on knowledge of a person skilled in the art, the combinations and the orders of the processes in the respective embodiments can be appropriately rearranged and various modifications, such as a change of design, can be added to the respective embodiments. The claims include the embodiments including the modifications added therein.

According to the above embodiment, a case where the screen printing is used as a method for printing the coating, has been described. Other printing methods may be used. For example, an offset printing method in which coating embedded in a recess portion of a printing plate is transferred to a columnar blanket and then the coating transferred to the blanket is applied to the light receiving surface 70a, may be used. Alternatively, a pad printing method and known techniques, such as letterpress printing and intaglio printing, may apply coating.

The solar cell elements 70 described according to the above embodiment, includes the p-type amorphous layer provided on the side of the light receiving surface 70a of the semiconductor substrate and the n-type amorphous layer provided on the side of the back surface 70b. Solar cell elements each including the respective conductive types provided inversely, may be used. A p-type single crystal silicon substrate may be used for the semiconductor substrate.

According to the above embodiment, the coating having light diffusivity is applied so that the light diffuser 60 is formed. According to a modification, a material having light diffusivity may be disposed in the outer circumferential region C1 and then the light diffuser may be formed. For example, a resin material having light diffusivity may be formed so as to be tape-shaped and may be applied to the outer circumferential region C1 of the light receiving surface 70a, using an adhesive or the like. Alternatively, a material formed so as to be frame-shaped in accordance with the shape of the outer circumferential region C1, may be disposed on the light receiving surface 70a.

It should be understood that the invention is not limited to the above-described embodiment, but may be modified into various forms on the basis of the spirit of the invention. Additionally, the modifications are included in the scope of the invention.

What is claimed is:

1. A solar cell module comprising:
   a solar cell element including:
      a light receiving surface on which light is incident, the light receiving surface comprising an inner region and an outer circumferential region surrounding the inner region;
      a back surface disposed opposite the light receiving surface; and
      a side surface extending between the light receiving surface and the back surface;
      a plurality of finger electrodes that extends in parallel to each other on the light receiving surface; and
      a bus bar electrode that extends cross the plurality of finger electrodes on the light receiving surface;
   a light diffuser provided in the outer circumferential region of the light receiving surface while the light diffuser is not provided in the inner region of the light receiving surface; and
   an encapsulant covering the light receiving surface and the light diffuser,
   wherein the light receiving surface includes a left side and a right side parallel to the finger electrodes and an upper side and a lower side parallel to the bus bar electrode,
   wherein the light diffuser includes a first light diffuser provided along each of the left side and the right side of the light receiving surface, and a second light diffuser provided along each of the upper side and the lower side of the light receiving surface, and
   wherein a width of the first light diffuser in a first transverse direction perpendicular to the left side or the right side of the light receiving surface is smaller than a width of the second light diffuser in a second transverse direction perpendicular to the upper side or the lower side of the light receiving surface.

2. The solar cell module according to claim 1, wherein
   the solar cell element includes a semiconductor substrate and a semiconductor layer that is provided on the semiconductor substrate and has one conductive type, and
   the semiconductor layer is formed on the semiconductor substrate so as to cover an entire surface of the semiconductor substrate including an outer circumferential region.

3. The solar cell module according to claim 1, wherein
   the light receiving surface has an octagonal shape made by cutting off each of four corners of a rectangle surrounded with the left side, the right side, the upper side, and the lower side of the light receiving surface, and
   the light diffuser further includes a corner light diffuser provided along at least one of the four corners with corner-cutoff.

4. The solar cell module according to claim 1, wherein the width of the first light diffuser in the first transverse direction or the width of the second light diffuser in the second transverse direction is larger than a width of each of the finger electrodes in a third transverse direction perpendicular to the finger electrodes.

5. The solar cell module according to claim 1, wherein the light diffuser is further provided on the side surface of the solar cell element.

6. The solar cell module according to claim 3, wherein a width of the corner light diffuser in a transverse direction perpendicular to the at least one of the corner four corners with the corner-cutoff is greater than at least one of the width of the first light diffuser and the width of the second light diffusers.

7. The solar cell module according to claim 1, wherein the light diffuser includes insulating material mixed with particles of titania ($TiO_2$) or alumina ($Al_2O_3$).

8. The solar cell module according to claim 1, wherein the back surface comprises an upper side, a lower side opposite the upper side, a left side extending between the upper side and the lower side, and a right side opposite the left side,
   wherein the side surface comprising an upper side surface extending between the upper side of the light receiving surface and the upper side of the back surface, a lower side surface extending between the lower side of the light receiving surface and the lower side of the back surface, a left side surface extending between the left side of the light receiving surface and the left side of the back surface, and a right side surface extending between the right side of the light receiving surface and the right side of the back surface, wherein the light diffuser is provided in the outer circumferential region of the light receiving surface and at least a part of the side surface while the light diffuser is not provided in the inner region of the light receiving surface, wherein the first light diffuser provided along each of 1) the left side of the light receiving surface and at least part of the left side surface and 2) the right side of the light receiving surface and at least a part of the right side surface, and wherein the second light diffuser provided along each of 1) the upper side of the light receiving surface and at least part of the upper side surface and 2) the lower side of the light receiving surface and at least part of the lower side surface.

* * * * *